United States Patent
Clutter et al.

(10) Patent No.: US 6,182,266 B1
(45) Date of Patent: Jan. 30, 2001

(54) SELF-AUDITING PROTECTION METHOD FOR SORTED ARRAYS

(75) Inventors: Sherwin J. Clutter, Aurora; David F. Simak, Wheaton, both of IL (US)

(73) Assignee: Lucent Technologies, Inc., Murray Hill, NJ (US)

(*) Notice: Under 35 U.S.C. 154(b), the term of this patent shall be extended for 0 days.

(21) Appl. No.: 08/928,848

(22) Filed: Sep. 12, 1997

(51) Int. Cl.[7] .................. G06F 11/10; H03M 13/00; G11C 7/00
(52) U.S. Cl. ................... 714/807; 714/8; 365/218
(58) Field of Search ..................... 714/807, 710, 714/721, 723, 8; 369/54; 365/218, 201

(56) References Cited

U.S. PATENT DOCUMENTS

| | | | |
|---|---|---|---|
| 3,756,404 | * 9/1973 | King et al. | 209/74 R |
| 4,448,526 | * 5/1984 | Miyazawa | 356/237 |
| 5,235,585 | * 8/1993 | Bish et al. | 369/54 |
| 5,319,627 | * 6/1994 | Shinno et al. | 369/54 |
| 5,577,194 | * 11/1996 | Wells et al. | 714/710 X |

\* cited by examiner

*Primary Examiner*—Emmanuel L. Moise

(57) ABSTRACT

An error detection system for an array of data elements is disclosed. In this system, each data element in the array includes first and second error detection fields. As the system traverses the array, a detecting mechanism sequentially compares the first error detection field with the second error detection field for each data element in order to determine whether the data element is corrupt. The detecting mechanism also compares the first error detection field of adjacent data elements in order to identify duplicates. If an invalid element (i.e. corrupt or a duplicate) is detected, the system then removes or deletes the element from the array.

7 Claims, 6 Drawing Sheets

FIG. 1 - INTERRUPTION AFTER ELEMENT ALLOCATION

FIG. 2 - INTERRUPTION DURING COPY OPERATION OF ELEMENT

FIG. 3 - INTERRUPTION BETWEEN ELEMENT COPY OPERATIONS

FIG. 4 - INTERRUPTION BEFORE DELETE CAN COMMENCE

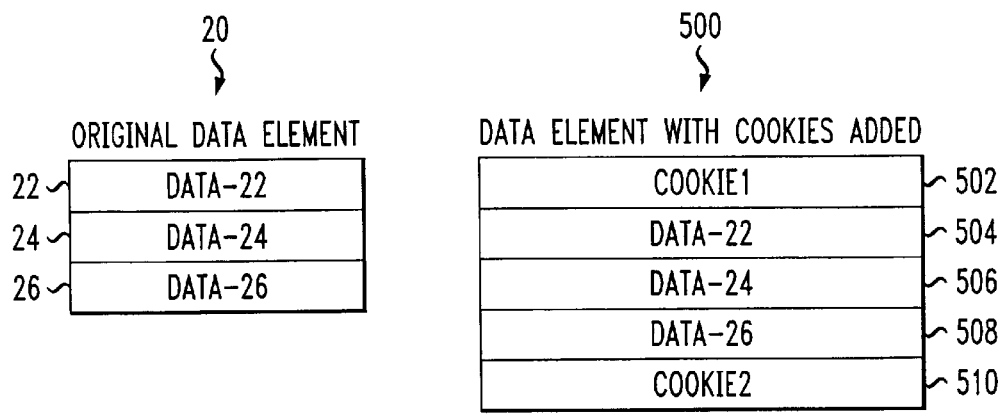
FIG. 5 - MODIFICATION TO DATA ELEMENT
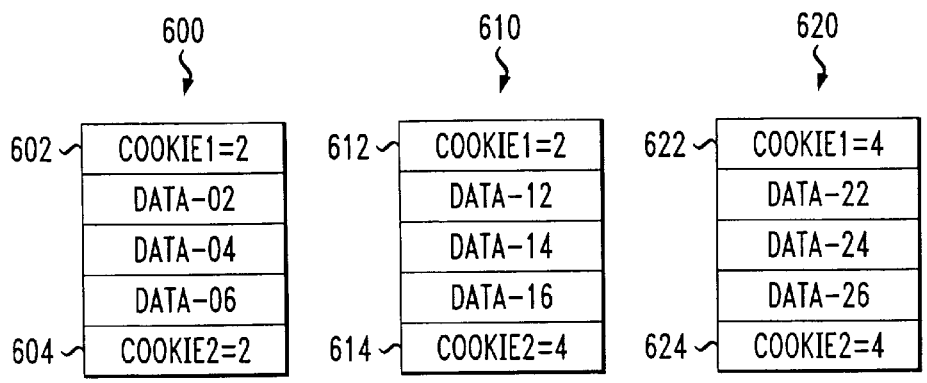
FIG. 6 - DETECTION OF ELEMENT COPY FAILURE
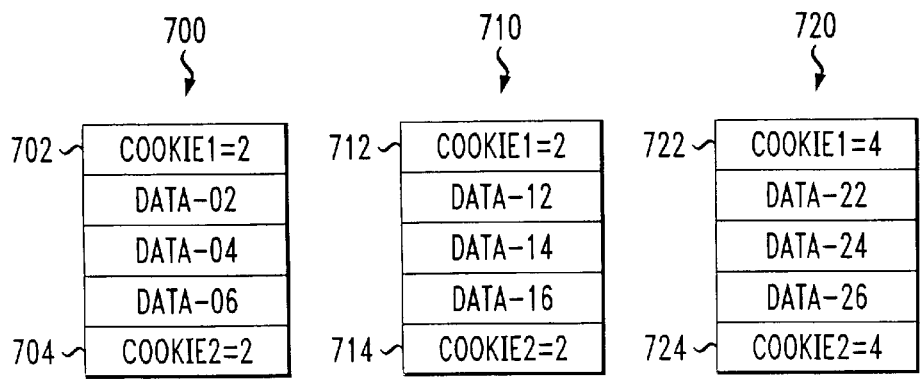
FIG. 7 - DETECTION OF DUPLICATE ELEMENTS

SELF-AUDITING PROTECTION METHOD FOR SORTED ARRAYS

BACKGROUND OF THE INVENTION

This invention relates to the detection of invalid data elements stored in an array. More specifically, this invention pertains to a self-auditing protection method for a sorted array in which corrupt and/or duplicate data elements are detected and deleted during traversal of the sorted array.

In order to maximize efficiency and minimize delays associated with information retrieval, data elements within an array are typically "sorted" or arranged in numerical or alphabetical order. Many computer applications and operating systems include a built-in sorting program such as Quicksort, published in 1962 by C.A.R. Hoare, or computer sorting routines such as: (1) bubble sort; (2) insertion sort; (3) merge sort; (4) selection sort; and (5) shell sort. However, if the sorting process is prematurely terminated, before each data element has been moved to its appropriate array position, data elements may be duplicated or corrupted.

There are two existing techniques in the prior art which attempt to solve the above-identified problem. The first technique uses cyclic redundancy (check) code ("CRC") in conjunction with data elements in an array. In short, CRC auditing involves the calculation of a CRC value based upon a formula which uses the data contained in each array element as variables. The result of that calculation, the CRC value, is then appended onto the end of each data element. Various calculation methods can be used to generate the CRC value; however, the CRC calculation method is generally chosen to optimize error detection capability. In order to check for an error in the data element, the calculation is performed again and compared with the stored answer, the CRC value. If the two calculations are different, an error is detected.

For large data elements, generating the CRC value is time consuming and for small data elements, the CRC algorithm is susceptible to erroneous detection of duplicates. Further, either of these problems can be aggravated depending on the selected CRC algorithm.

Another technique involves the use of doubly-linked lists. Doubly-linked lists provide a way to manage data that is not stored sequentially in a computer. In essence, a doubly-linked list contains three parts, the data itself, a first number (ie. pointer) which identifies the location of the previous item on the list, and a second number (i.e. pointer)which identifies the location of the next item on the list. However, the use of linked lists requires a relatively complex resource allocation scheme and a complex auditing mechanism. In addition, the recovery of broken linkages (i.e. when the pointer does not properly identify the location of the next or previous item on the list) is time-consuming and requires complex data analysis to recover all possible breakages and resource losses. Furthermore, the process which is traversing the doubly-linked list cannot proceed if errors are encountered.

In many data intensive applications sorting techniques requiring the use of CRCs or doubly-linked lists are unacceptable. A new system for detecting corrupt data elements stored in a computer as an array of data elements is necessary.

SUMMARY OF THE INVENTION

An object of the present invention is to provide a method and system of detecting and deleting invalid data elements contained within an array, including data elements that are duplicates as well as those that are corrupt, in which each traversal of the sorted array detects and discards the invalid data elements.

The invention takes the form of an error detection system for an array of data elements in which each data element has a first error detection field and a second error detection field. The first and second error detection fields are both assigned the same number which is unique and different from the numbers assigned to the error detection fields of the remaining data elements. The array of data elements is stored in a storing mechanism such as memory. As the error detection system traverses the array of data elements, a detecting mechanism sequentially compares the first error detection field with the second error detection field for each data element in order to determine whether the data element is corrupt. If the contents of the first error detection field does not equal the contents of the second error detection field, the data element is corrupt, otherwise, the data element is valid. A detecting mechanism also compares the first error detection field of one of the data elements with the first error detection field of another of the data elements. If the first error fi detection field of said one of the data elements equals the first error detection field of said another of the data elements, said another of the data elements is a duplicate of said one of the data elements. In any event, if a corrupt or duplicate data element is detected, a removing mechanism then removes or deletes the invalid element from the array.

These as well as other novel advantages, details, embodiments, features and objects of the present invention will be apparent to those skilled in the art from the following detailed description of the invention, the attached claims and accompanying drawings, listed hereinbelow, which are useful in explaining the invention.

BRIEF DESCRIPTION OF THE DRAWINGS

In the text which follows and in the drawings, wherein similar reference numerals denote similar elements throughout the several views thereof, the present invention is explained with reference to illustrative embodiments in which:

FIG. 5 illustrates the proposed structural modification to existing data elements in the preferred embodiment of the present invention;

FIG. 6 illustrates how the preferred embodiment of the present invention detects element copy failures;

FIG. 7 illustrates how the preferred embodiment of the present invention detects erroneous duplicative elements within the array.

DETAILED DESCRIPTION OF THE PREFERRED EMBODIMENT

Figure 1A:
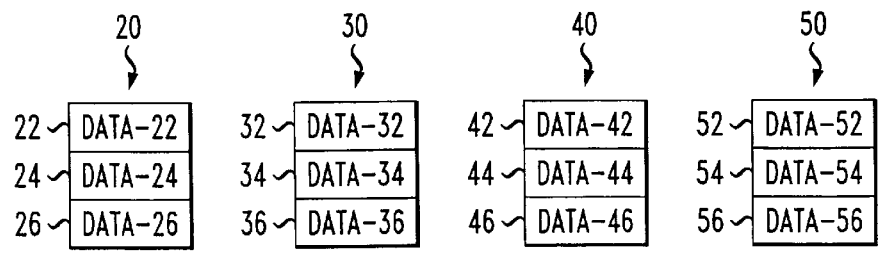
FIGS. 1A, 2A, 3A and 4A depict the normal contents of data elements in an array.

For a better understanding of the present invention, reference may be had to the following detailed description taken in conjunction with the appended claims and accompanying drawings. In essence, the present invention enables any process which uses an array to check for corruption of array data elements and unintentional duplication of array data elements. Corruption of array data elements is determined by comparing the two error detection fields (i.e. Cookie1 and Cookie2) within each data element. Duplication of a data element is determined by comparing the Cookie1 error detection field of the data element to the Cookie1 error detection field of another data element.

As illustrated in FIG. 1, a sorted array is a data structure containing sorted groups of data, such as numbers and/or characters. The groups of data are commonly known as data elements (20, 30, 40, 50). Each data element includes related data items which are stored individually as fields (22, 24, 26, 32, 34, 36, 42, 44, 46, 52, 54, 56). Each field (e.g. 22) is generally associated with the other fields (24, 26) within the same data element (20). For example, a data element (20) may represent a person's fall name. In this example, one field (22) in the data element (20) would represent the person's first name, another field (24) would represent the person's middle name, and the last field (26) would represent the person's last name. Thus, in this example, the sorted array would contain data elements that identify the names of a number of different people. Within each data element, the three fields identify the person's first name, middle name, and last name. As can a be easily understood, many different types of information can be stored in data elements and fields to within stored arrays of various sizes.

When sorted arrays are created by computer programs, the arrays are normally allocated a fixed amount of amount of memory in which to store data. This allocated memory is broken down into two portions, an IN-USE portion and a FREE portion. The IN-USE portion is the memory currently being used to store valid data in the sorted array. In contrast, the FREE portion is the memory allocated to the sorted array that is not currently being used. Thus, for a computer manipulating a sorted array, the IN-USE portion contains valid data, while the FREE portion is the memory that is available for use.

As data is added to the sorted array, a block of memory from the FREE portion will be "transferred" to the IN-USE portion. The "transfer" of allocated memory blocks between the two memory portions is accomplished by manipulating a control element. A control element is used to identify the boundary or boundaries between the FREE and IN-USE portions. Normally, the control element includes an index which "points" to a valid data element (20, 30, 40, 50) in the sorted array. Because data elements (20, 30, 40, 50) are stored sequentially in memory, the index can be incremented or decremented respectively to traverse the entire sorted array.

When new data is added to the sorted array, the array will create a new data element to contain the newly entered data. Before the new data is added to the sorted array, an unused portion of memory must be moved from the FREE to IN-USE portion by adjusting the control element. Once a memory location is transferred to the IN-USE portion, the new data element will be "inserted" into the sorted array. Usually, the sorted array will be re-sorted to accommodate the insertion of the new data element. From the point in time when the memory is transferred from the FREE portion to the IN-USE portion until the sorted array has been re-sorted, an interruption in the insertion/sorting process can result in one of three possible errors.

Figure 1B:
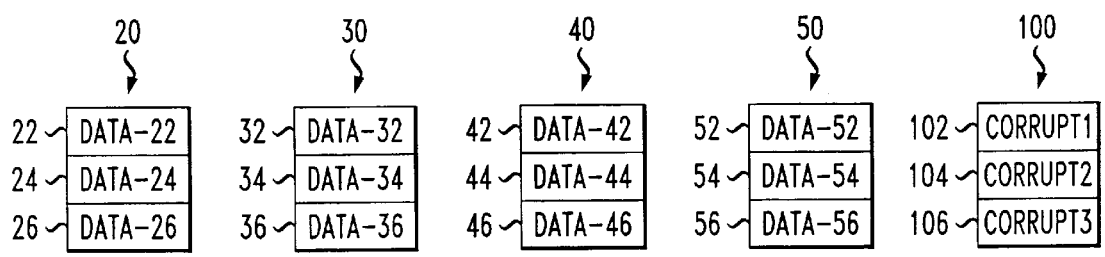
FIG. 1B depicts the contents of data elements in an array after an interruption of the data element insertion process.

FIGS. 1A and 1B depict the first possible error. The data elements (20, 30, 40, 50) and their contents (i.e. Data-22, Data-24, Data-26, Data-32, etc.) in the sorted array are shown before insertion in FIG. 1A, and also after the insertion process has been interrupted in FIG. 1B. As can be seen in FIG. 1A, the order of the data elements (20,30,40,50) is sorted in ascending numerical order. When an interruption occurs during the insertion process, the newly added data element (100) will contain corrupt data (102, 104, 106).

Figure 2A:
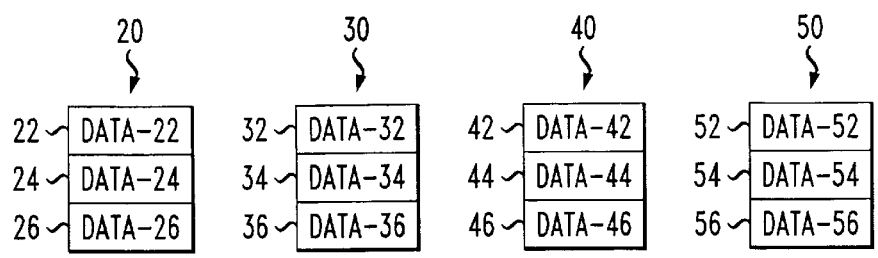
Figure 2B:
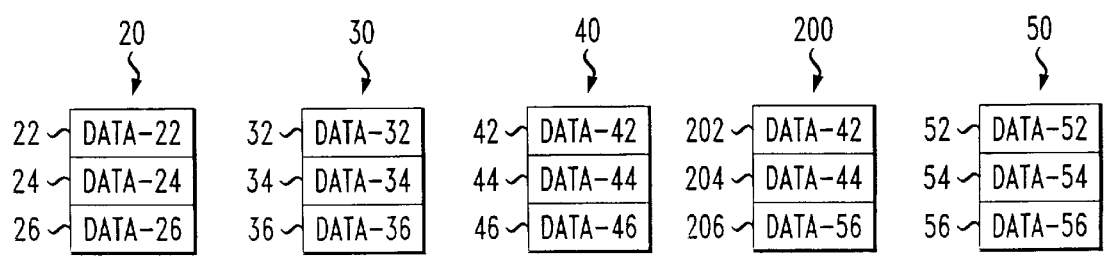
FIG. 2B shows the contents of data elements in an array after an interruption of the data element copying process.

FIGS. 2A and 2B depict the second possible error. The data elements (20, 30, 40, 50, 60) and their contents (i.e. Data-22, Data-24, Data-26, Data-32, etc.) in the sorted array are shown before an interruption of the data element copying process (FIG. 2A), and also after the copying process has been interrupted (FIG. 2B). An interruption during the copying process can cause corruption of a data element (200). The interruption can also cause an unintentional duplication of data elements (not shown) or of fields within data elements (56, 206). As shown in FIG. 2B, data element 206 is corrupt and is a partial duplicate of data element 56.

Figure 3A:
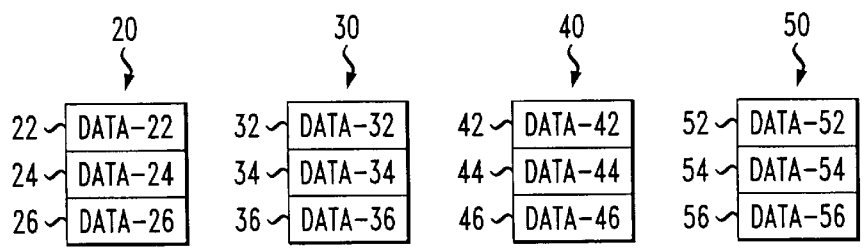
Figure 3B:
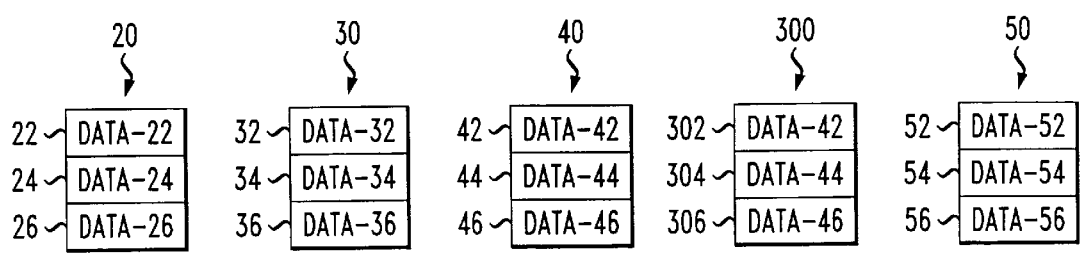
FIG. 3B illustrates the contents of data elements in an array after an interruption of the data element sorting process.

FIGS. 3A and 3B depict the third possible error. When an interruption occurs after the copying process has finished (FIG. 3A), but before the resorting process is complete, a duplicate data element is erroneously created. As can be seen in FIG. 3B, data element (40) is an exact duplicate of data element (300).

Figure 4A:
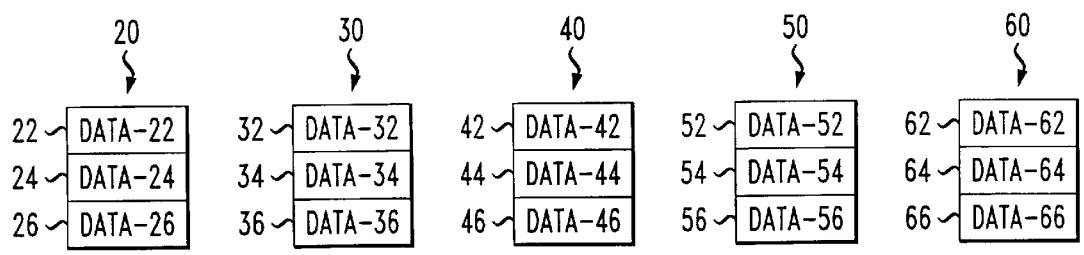
Figure 4B:
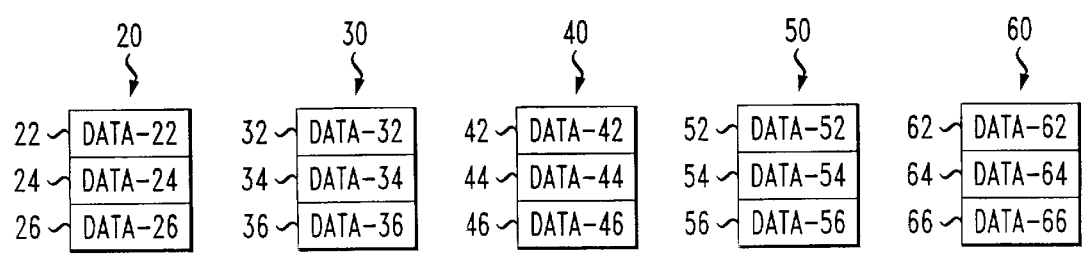
FIG. 4B depicts the contents of data elements in an array wherein the deletion process was interrupted.

Similarly, deletion of a data element from a sorted array requires both a resorting of the array as well as a reallocation of memory. When a data element is deleted, the memory used by the deleted data element must be moved from the IN-USE portion back to the FREE portion. In addition, the array usually must be resorted to adjust for the missing data element. From the point in time when the delete operation commences until the point where the boundary between the IN-USE and FREE portions of the array is updated to reflect the deletion, an interruption of the sorting/deletion process can also result in one of three possible errors:

The first possible error of this type is depicted in FIGS. 4A and 4B. FIG. 4A shows the data elements (20, 30, 40, 50, 60) in a stored array before any process has been performed. FIG. 4B shows the contents (e.g. Data-22, Data-24, Data-26, etc.) of data elements (20, 30, 40, 50, 60) in a sorted array when the deletion process is interrupted before the deletion process has commenced. For example, if data element (40) in FIG. 4A was to be deleted, and the deletion process was interrupted before the process started, data element (40) would not be deleted (See FIG. 4B). Consequently, data element (40) would still be present in the sorted array (See FIG. 4B), and the computer program would be under the erroneous assumption that data element (40) contained valid data, despite that fact data element (40) should have been deleted.

Because the deletion process also uses the copying function, copying errors can also occur during deletion. As previously discussed, FIG. 2B illustrates the contents (e.g. Data-22, Data-24, Data-26, etc.) of the data elements (20, 30, 40, 50) in a sorted array after an interruption of the data element copying process. Similarly, because the deletion function also uses a sorting process, sorting errors can also occur during deletion. Also a previously discussed, FIG. 3B shows the contents (e.g. Data-22, Data-24, Data-26, etc.) of data elements (20, 30, 40, 50) in an array after an interruption of the data sorting process.

In order to detect the above-identified error conditions, the audit mechanism of the present invention was developed. In particular, the audit mechanism of the present invention detects error conditions 1 through 3 of the insertion process and errors 2 and 3 of the deletion process. As illustrated in FIG. 5, this detection is accomplished by the addition of two "audit," or error detection, fields (502, 510) to each data element (e.g. 20) in an array. In the present invention, the error detection fields (502,510) are called Cookie1 and Cookie2; however, any other label could certainly be used. In the preferred embodiment, Cookie1 is located at the "top" of each data element (500) in field (502), and Cookie2 is located at the "bottom" of each data element (500) in field (510). In an alternate embodiment, the quantity and locations of the error detection fields (502, 510) may be changed (not shown), so long as one of the cookies corresponds to when a copy function is started and another cookie corresponds to when a copy function is completed.

In general, Cookie1 and Cookie2 (502, 510) represent the boundaries of memory locations associated with the fields (504, 506, 508) of each data element (500) in the sorted array. Thus, the data contained within in each individual data element (500) is stored between these two memory locations. As illustrated, data fields (504, 506, 508) are located between the two cookie fields (500, 510).

In addition to the two error detection fields (502, 510) located in each data element (500), the present invention also uses a global control variable called SysCookie. SysCookie is used to generate a unique value that is stored in the Cookie1 and Cookie2 fields (502, 510) for each given data element (500). The value generated by SysCookie that is stored in Cookie1 and Cookie2 (502, 510) is unique for each data element. In other words, no two valid data elements should have the same value stored in their respective Cookie I fields (502). So long as the contents of the Cookie1 and Cookie2 fields (502, 510) are equal for a given data element (500), the data element (500) contains valid data. If the Cookie1 and Cookie2 fields (502, 510) are not equal, the data element (500) is corrupt. Similarly, if the Cookie1 field (502) of two different data elements are equal, one of the data elements is a duplicate of the other data element, because each data element should have an unique (i.e. different) value in its Cookie1 field (502).

Any computer program capable of generating unique values can be used as SysCookie. In an alternate embodiment, a random number generating program could also be used as SysCookie. In any event, the range of numbers or values generated by SysCookie should be sufficiently large such that the probability of a given value appearing in more than one data element of the IN-USE portion of the array is statistically insignificant or otherwise significantly reduced. In the preferred embodiment, the value of SysCookie is incremented each time a data element (500) is inserted into the stored array. Although SysCookie is preferably incremented by a value of one, and any other incrementation value can certainly be used in an alternate embodiment. In any event, the same value that is generated by SysCookie is used in both the Cookie1 and Cookie2 fields (502, 510). According to the present invention, data element (500) is presumed to be valid and not corrupt, so long as the Cookie1 and Cookie2 fields (502, 510) contain the same value.

Figure 8:
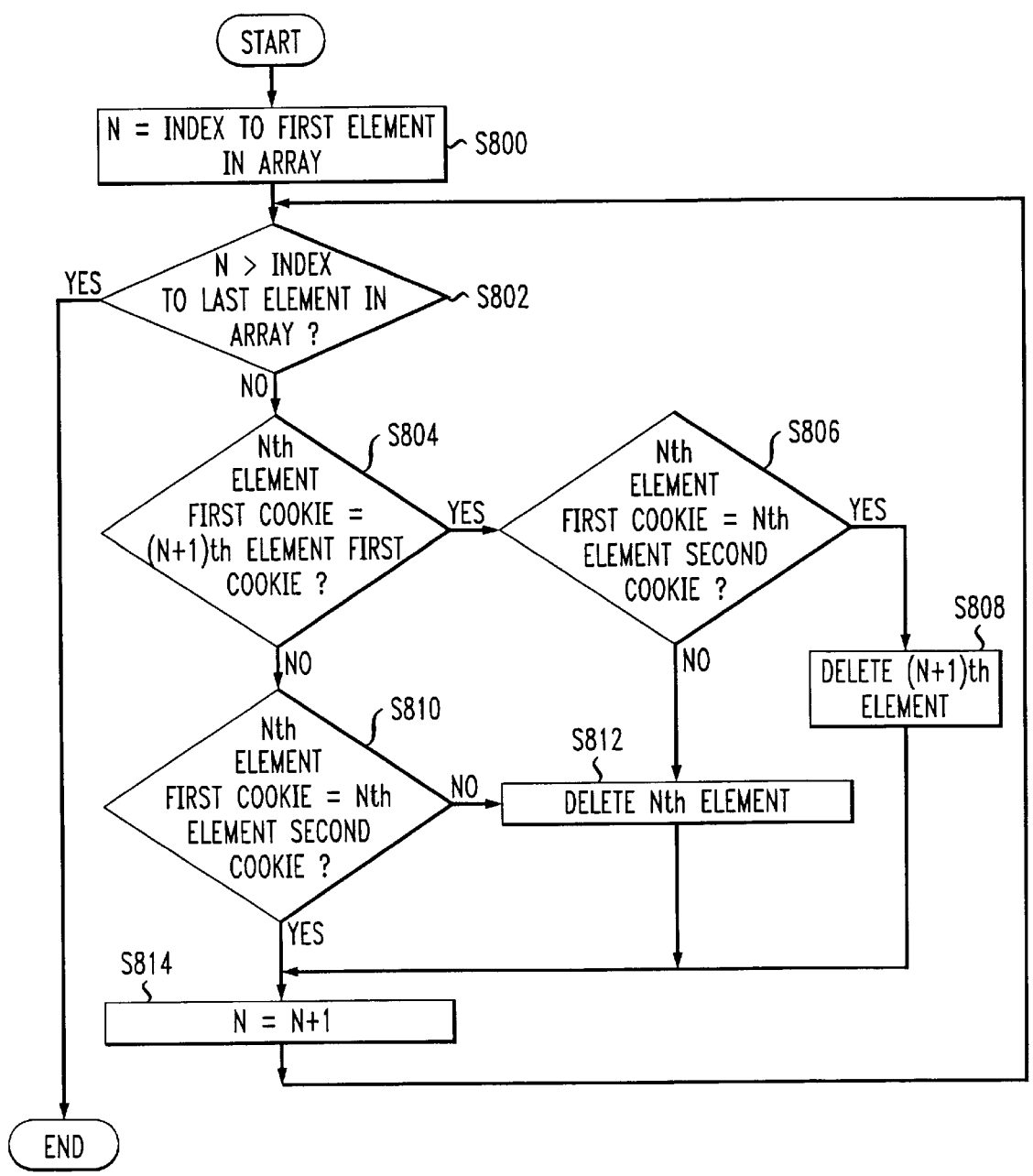
FIG. 8 is a flow chart illustrating the preferred method by which processes using the present invention traverse the sorted array.

FIG. 8 shows a flow chart of the preferred method by which processes using the present invention traverses a sorted array. This traversal method detects and corrects the above-identified insertion and deletion error conditions that cause corruption and erroneous duplication of data elements.

The traversal method begins by establishing a variable N which corresponds to the control element index of the sorted array to be audited. The type and size of this variable is not restricted and can fluctuate with different types and sizes of indices for sorted arrays. Variable N is given the same value as the index pointing to the first element in the sorted array (S800). In other embodiments, variable N can be initially set to any location or data element in the array, thereby enabling a very long array of data elements to conduct self-audits in portions of the array without having to conduct an audit of the entire array.

After initializing variable N, the traversal process initiates a looping function which sequentially examines the entire portion of the sorted array to be audited. The looping function begins by determining whether the auditing process is at the end of the portion of the array to be audited this is accomplished by checking whether the value of variable N is greater than the value of the last element in the array (S802). If the value of variable N is greater than the value of the last data element, the traversal process is complete and the process terminates. This step (S802) is preferably performed first in order to ensure that the traversal process never wastes time auditing data in the FREE portion of memory. Thus, the auditing process is restricted to checking data in the IN-USE portion. In other embodiments, this step may be substituted by adding another field in the data element that contains a flag which would signal when the audit process is complete. This flag field would allow for multiple audits of the sorted array or allow an audit to begin in the middle of the array, but still audit the entire array.

If the value of variable N is not greater the last element in the sorted array, the traversal method determines whether the Nth data element's Cookie1 value is the same as (N+1)th data element's Cookie1 value (S804). This step determines whether adjacent data elements are duplicate (i.e. erroneous). In other embodiments, the Nth data element's Cookie1 value can be compared to any other data element's Cookie1 value, which may not necessarily by the (N+1)th data element.

FIG. 7 illustrates the detection of identical data elements that are adjacent. As previously mentioned, the erroneous duplication of data elements can be caused by interruptions in the sorting process during both the insertion and deletion of data elements. As illustrated in FIGS. 2 and 3, when a copying or resorting process is interrupted, data elements containing identical data are created in the sorted array. Because no two data elements within the same sorted array can have the same Cookie1 value, data elements (700, 710, 720) with matching Cookie1 values (702, 712) are duplicates. Since data element (700) is a duplicate of data element (710), one of the data elements (700, 710) must be deleted.

FIG. 6 illustrates the detection of a corrupt data element. As mentioned previously, data elements (e.g. 600) must contain matching Cookie1 (602) and Cookie2 (604) audit fields in order to be valid. If the two cookie fields (602, 604) do not match, a copying process was interrupted and the data is corrupt. In the example of FIG. 6, data element (600) is valid because the Cookie1 (602) value of 2 equals the Cookie2 (604) value of 2. Similarly, data element (620) is valid because the Cookie1 (622) value of 4 equals the Cookie2 (624) value of 4. In contrast, data element (610) is corrupt because the Cookie1 (612) value of 2 does not equal the Cookie2 (614) value of 4.

Thus, if the two cookie values do not match in step (S810), the Nth data element is corrupt. If corrupt, the Nth data element is deleted from the sorted array (S812). The value of variable N is then incremented to point to the next data element in the array and continue the traversing and/or auditing process (S814).

In situations, such as depicted in FIGS. 6 and 7, where the Cookie1 (602, 702) value of the Nth data element (600, 700) is equal to the Cookie1 (612, 712) value of the (N+1)th data element (610, 710) (S806), the (N+1)th data element (610, 710) is deleted (S808). This is due to the fact that the Nth data element (610, 710) is either corrupt (612) or a duplicate (712). After deletion (S808), the value of N is the incremented to point to the next data element (e.g. 620, 720) in the assorted array (S814).

As previously mentioned, the traversing and/or auditing process of the present invention will continue looping and checking for corrupt and duplicate data elements until the value of variable N has been incremented past the pointer to the last data element in the sorted array.

Figure 9:
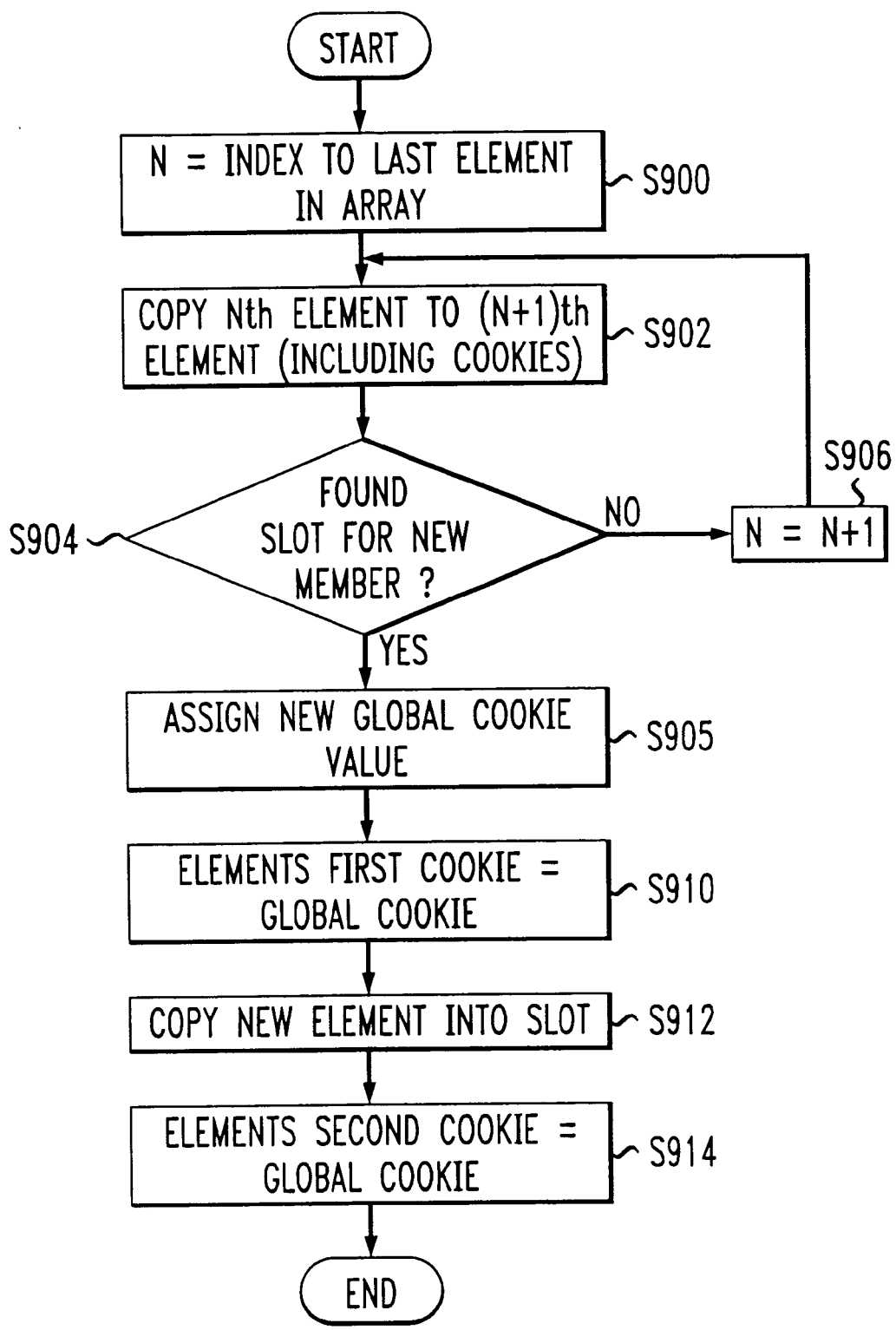
FIG. 9 is a flow chart depicting the preferred method by which processes using the present invention insert data elements into the sorted array.

Because the self-auditing method of this invention uses the cookie fields for comparison purposes, special processes are used to insert and delete data elements. FIG. 9 shows a flow chart of the preferred method by which processes using the present invention insert data elements into the sorted array.

As can be seen in FIG. 9, the insertion method begins by establishing a variable N which is the same type and size of variable as the index to the sorted array. The type and size of this variable is not restricted and can fluctuate with different types and sizes of arrays.

Variable N is initially assigned the same value as the index to the last element in the sorted array (S900). In essence, this places the newly inserted data element at the end of the sorted array. After initializing variable N, the insertion process will begin a looping function which identifies an appropriate location in the sorted array for the new data element. This looping function begins by copying the Nth data element's data to the memory location of the (N+1)th data element (S902). The copying of the Nth data element's data will necessarily include the copying of cookie values, Cookie1 and Cookie2. If a slot for the new member is found, the insertion function will exit the looping function and continue with the insertion process (S904). However, if an appropriate slot is not found in the sorted array, the value of variable N will be decreased by one (S906) and the process will return to step (S902). Steps (S902, S904, S906) will continue copying the Nth data element's data to the (N+1)th data element until the appropriate slot is found for the new data element. In the preferred method, the looping function uses a bubble sort routine that determines the appropriate location is for the new data element. Although the bubble sort method is preferred, other sort routines can certainly be used.

Once the appropriate memory slot is found for the new data element and the looping function a is broken, the next step is to update the global control variable, SysCookie (S908), which is incremented to reflect the insertion of a new data element into the array. After SysCookie has been updated, the value of SysCookie will be copied to the new data element's Cookie1 field (S910). Because the previously mentioned looping function stopped with the new slot being pointed to by variable N, the new data element will then be copied to its new slot located at N (S912). After the new data element is copied, the value of SysCookie will also be copied to the new data element's Cookie2 field (S914).

After SysCookie has been copied to the two cookie values of the new data element, Cookie1 and Cookie2, the insertion process is complete. In other embodiments, the copying of cookie values may entail a looping function to copy multiple cookie values if there are more than two cookie audit fields in the data element.

Figure 10:
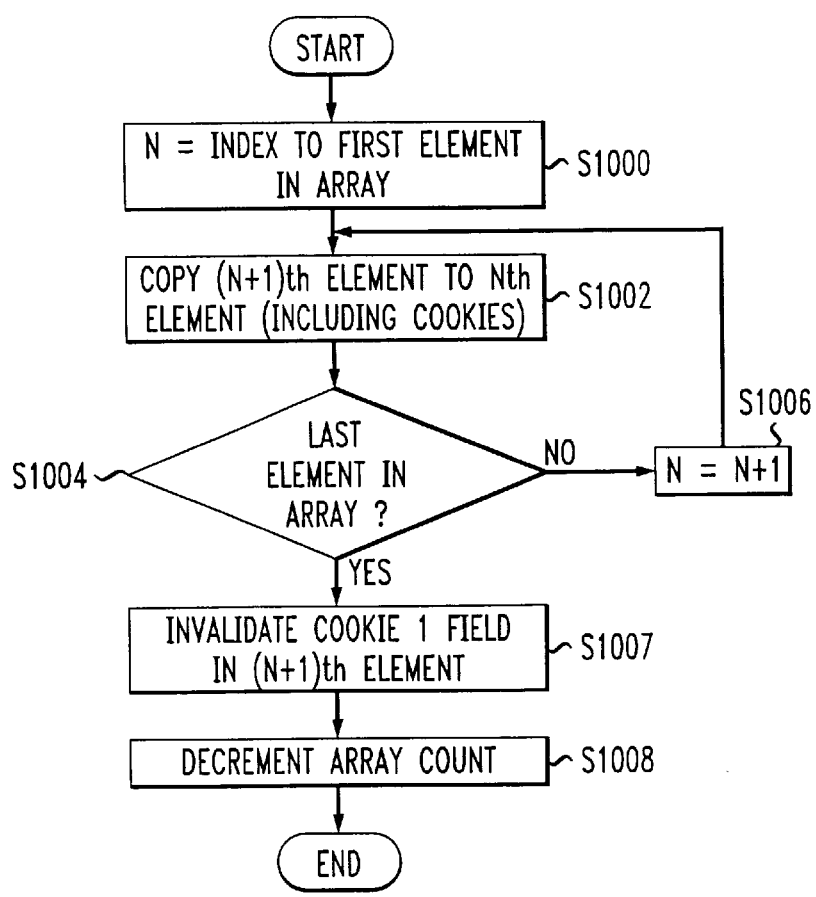
FIG. 10 is a flow chart illustrating the preferred method by which processes using the present invention delete data elements from the sorted array.

As depicted in FIG. 10, the present invention also uses a special deletion process. More particularly, FIG. 10 shows a flow chart of the preferred method by which processes using the present invention deletes data elements from the sorted array.

The deletion method begins by establishing a variable N which is the same type and size of variable as the index to the sorted array. The type and size of this variable is not restricted and can fluctuate with different types of indexes and sizes of arrays. Variable N is assigned the same value as the index, or pointer, to the data element in the sorted array to be deleted (S 1000). In short, the deletion method uses a looping process to copy over the data element to be deleted. After variable N is initialized, the loop begins by copying the data of the (N+1)th data element to the Nth data element (S1002). The copying of data includes copying of both cookie values, Cookie1 and Cookie2.

After the (N+1)th data element is copied to the Nth data element, the next step is to determine if the variable N is at the last element in the sorted array (S1004). If variable N is not at the last element of the array, the value of N will be incremented (S 1006). After being incremented, the looping process will be begin again (S 1002) and continue until the process has reached the end of the array.

Once the end of the array is reached, the Cookie1 field of the (N+1)th element is invalidated (S1007). In other words, when the data element is moved from the IN-USE portion of the array to the FREE portion of the array, the data element's Cookie1 field is invalidated (S 1007). Thus, when a new element is added into the IN-USE portion of the array, it does not contain valid data until the new data is copied into it. Next, the value of variable N is decremented (S1 008), because the sorted array contains one less data element. The continuous loop described in steps (S1002–S1006) shifts the data elements down by one which allows the last data element to be deleted by decreasing variable N (i.e. the array counter). After decrementing variable N, the deletion process is complete.

Figure 11:
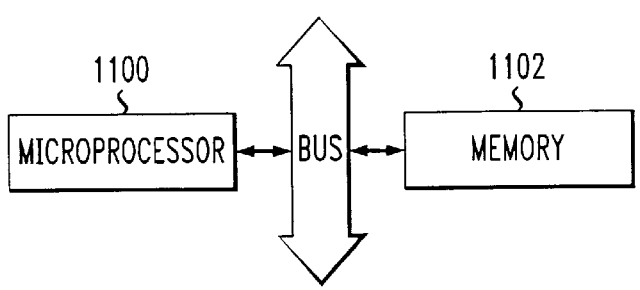
FIG. 11 depicts a schematic of a suitable hardware configuration for the present invention.

This invention may be implemented in a variety of hardware systems that use sorted arrays. For example, one such system is Lucent Technologies Inc.'s SN-CP processor of the GlobeView-2000® Switch. The SN-CP processor of the GlobeView-2000® Switch maintains a queue of maintenance requests. This maintenance queue is implemented as an array. Specific hardware maintenance concerns require this queue to be sorted on a priority basis causing the queue to inherit all of the possible errors associated with sorting data within an array. Any process running on the SN-CP processor of the GlobeView-2000 Switch has a potential for being terminated under fault conditions. The information in the maintenance queue is important enough that it is preserved over process terminations and is inherited by the restarted system process. The nature of maintenance requests is such that it is critical to system performance that an "invalid" maintenance request is not performed, thus a mechanism to guarantee the validity of data within the queue is required. In general, any microprocessor (1100), or other suitable device, capable of comparing cookie values and manipulating an array stored in memory (1102) can be used in conjunction with the method of the present invention. A schematic of a suitable hardware configuration is shown in FIG. 11.

In summary, the present invention uses and compares two error detection fields (i.e. Cookie1 and Cookie2) in each data element to check for and eliminate corrupt and duplicate data elements. In the preferred embodiment, the data elements of the array are stored in physical memory implemented as random access memory (RAM), however, any other type of memory could be used (e.g. magnetic tape, magneto-optical media, other electromagnetic media such as a computer hard drive, etc.) In this invention, a sorted array conducts a self-audit by using traversal, insertion and deletion processes. By requiring each data element to have matching numbers in both of its error detection fields and by requiring each data element to use a unique number in its error detection fields, the traversal, insertion and deletion processes can detect and correct errors that occur when a process is interrupted.

What is claimed is:

1. An error detection system for a sorted array of data elements comprising:

means for storing said sorted array of said data elements;

means for determining whether one of said data elements is an invalid element, said determining means identifying said invalid element during a traversal of said sorted array; and means for removing said invalid element from said sorted array of said data elements after said invalid element is detected.

2. The error detection system of claim 1 wherein said means for determining and said means for removing is a microprocessor.

3. The error detection system of claim 1 wherein said means for storing is random access memory.

4. The error detection system of claim 1 wherein each of said data elements includes a first error detection field and a second error detection field, whereby said means for determining compares the first error detection field of one of said data elements with the second error detection field of said one of said data elements in order to determine whether said one of said data elements is corrupt, and said means for determining compares the first error detection field of said one of said data elements with the first error detection field of another of said data elements in order to determine whether said another of said data elements is a duplicate of said one of said data elements.

5. A method of auditing an array of data elements, each of said data elements having a first error detection field and a second error detection field, said method of auditing comprising the steps of:

comparing the first error detection field of one of said data elements to the second error detection field of said one of said data elements; and processing said one of said data elements from the array if the first error detection field of said one of said data elements does not equal the second error detection field of said one of said data elements.

6. The method of auditing of claim 5 further comprising the steps of:

comparing the first error detection field of said one of said data elements to the first error detection field of another of said data elements; and deleting said another of said data elements from the array if the first error detection field of said one of said data elements equals said the first error detection field of said another of said data elements.

7. A method of auditing an array of data elements, each of said data elements having a first error detection field and a second error detection field, said method of auditing comprising the steps of:

establishing an index which points to one of said data elements in said array;

comparing the first error detection field of said one of said data elements to the second error detection field of said one of said data elements;

deleting said one of said data elements from the array if the first error detection field of said one of said data elements does not equal the second error detection field of said one of said data elements;

incrementing the index to another of said data elements if the first error detection field of said one of said data elements equals the second error detection field of said one of said data elements;

comparing the first error detection field of said one of said data elements to the first error detection field of said another of said data elements; and deleting said another of said data elements from the array if the first error detection field of said one of said data elements equals said the first error detection field of said another of said data elements.

\* \* \* \* \*